United States Patent
Pitkänen

(10) Patent No.: US 9,373,763 B2
(45) Date of Patent: Jun. 21, 2016

(54) LIGHT SOURCE AND LIGHT-SOURCE BAND

(75) Inventor: Temmo Pitkänen, Espoo (FI)

(73) Assignee: MARIMILS OY, Vantaa (FI)

( * ) Notice: Subject to any disclaimer, the term of this patent is extended or adjusted under 35 U.S.C. 154(b) by 0 days.

(21) Appl. No.: 13/985,444

(22) PCT Filed: Feb. 8, 2012

(86) PCT No.: PCT/FI2012/050115
§ 371 (c)(1),
(2), (4) Date: Aug. 14, 2013

(87) PCT Pub. No.: WO2012/110695
PCT Pub. Date: Aug. 23, 2012

(65) Prior Publication Data
US 2013/0320366 A1 Dec. 5, 2013

(30) Foreign Application Priority Data

Feb. 15, 2011 (FI) .................................. 20115139

(51) Int. Cl.
*H01L 29/18* (2006.01)
*H01L 33/56* (2010.01)
*H01L 25/075* (2006.01)
*H01L 33/58* (2010.01)
*F21Y 101/02* (2006.01)
*F21Y 103/00* (2016.01)

(52) U.S. Cl.
CPC . *H01L 33/56* (2013.01); *F21S 4/22* (2016.01); *F21Y 2101/02* (2013.01); *F21Y 2103/003* (2013.01); *H01L 25/0753* (2013.01); *H01L 33/58* (2013.01); *H01L 2224/45147* (2013.01); *H01L 2224/48091* (2013.01); *H01L 2224/73265* (2013.01)

(58) Field of Classification Search
CPC ......... H01L 33/56; H01L 33/44; H01L 33/52; H01L 33/00; H01L 31/02
USPC ................ 257/88, 89, 98, E33.061, E33.059; 36/136, 137; 362/235, 218, 260; 438/27, 46
See application file for complete search history.

(56) References Cited

U.S. PATENT DOCUMENTS

| 6,274,890 B1 * | 8/2001 | Oshio | H01L 33/486 257/100 |
| 6,505,955 B1 * | 1/2003 | Hatjasalo | B60Q 1/32 264/171.13 |
| 6,680,568 B2 * | 1/2004 | Fujiwara | H01L 24/32 257/E33.072 |
| 8,158,450 B1 * | 4/2012 | Sheats et al. | 438/57 |
| 2004/0232825 A1 * | 11/2004 | Sorg | H01L 33/486 313/501 |
| 2004/0256974 A1 * | 12/2004 | Mueller-Mach | C09K 11/7774 313/485 |
| 2005/0161694 A1 * | 7/2005 | Reeh | C09K 11/7718 257/100 |

(Continued)

FOREIGN PATENT DOCUMENTS

| KR | 10-2008-0046390 A | 5/2008 |
| WO | WO 98/23896 A1 | 6/1998 |
| WO | WO 2009/024278 A1 | 2/2009 |

*Primary Examiner* — Chuong A Luu
*Assistant Examiner* — Sheikh Maruf
(74) *Attorney, Agent, or Firm* — Birch, Stewart, Kolasch & Birch, LLP

(57) ABSTRACT

LED light source having at least one light-emitting component. The light-emitting component is at least partly protected with a transparent protective material, which contains aliphatic thermoplastic polyurethane (TPU). A light-source band also includes at least one light-emitting component.

21 Claims, 4 Drawing Sheets

(56) References Cited

U.S. PATENT DOCUMENTS

| | | | |
|---|---|---|---|
| 2005/0253158 A1* | 11/2005 | Yasukawa et al. | 257/98 |
| 2006/0097621 A1* | 5/2006 | Park | H05B 33/10 313/485 |
| 2007/0215890 A1* | 9/2007 | Harbers | C09K 11/7774 257/98 |
| 2008/0117500 A1* | 5/2008 | Narendran | H01L 33/507 359/326 |
| 2008/0211389 A1* | 9/2008 | Oshio | C04B 35/581 313/503 |
| 2009/0065792 A1* | 3/2009 | Thompson | H01L 33/54 257/98 |
| 2009/0109678 A1* | 4/2009 | Hsu | F21K 9/00 362/260 |
| 2009/0134414 A1* | 5/2009 | Li | B29C 9/006 257/98 |
| 2009/0212697 A1* | 8/2009 | Nakamura | B82Y 30/00 313/506 |
| 2009/0296382 A1* | 12/2009 | Maier | F21S 4/006 362/218 |
| 2010/0129525 A1* | 5/2010 | Shida | H05B 33/10 427/10 |
| 2010/0184938 A1* | 7/2010 | Robinson et al. | 528/65 |
| 2010/0237375 A1* | 9/2010 | Yamazaki et al. | 257/98 |
| 2010/0315817 A1* | 12/2010 | Zimmermann | 362/296.01 |
| 2011/0001148 A1* | 1/2011 | Sun | H01L 33/60 257/88 |
| 2011/0146792 A1* | 6/2011 | Wu et al. | 136/259 |
| 2011/0227477 A1* | 9/2011 | Zhang | B32B 18/00 313/503 |
| 2011/0275779 A1* | 11/2011 | Prissok et al. | 528/76 |
| 2011/0297970 A1* | 12/2011 | Lo et al. | 257/88 |
| 2012/0001214 A1* | 1/2012 | Ooyabu | B32B 9/005 257/98 |
| 2012/0175661 A1* | 7/2012 | Zhou | H01L 33/507 257/98 |
| 2012/0227901 A1* | 9/2012 | Fall et al. | 156/274.8 |

* cited by examiner

LIGHT SOURCE AND LIGHT-SOURCE BAND

BACKGROUND OF THE INVENTION

The object of the invention is a light source.

The object of the invention is also a light-source band.

The invention relates to light sources generally, more particularly to LED light sources. The invention also relates to light-source bands, which are used generally in control systems, guidance systems and warning systems.

Light sources, e.g. LED light sources, are typically protected with various plastic materials, such as with silicon. It has been observed that the materials used nowadays, from which elasticity is also required, are sensitive to UV light and/or to heat. This often results in deterioration of the clarity and/or transparency of the protective material, sometimes very quickly, and at the same time in a deterioration in the luminescent capability of the light source. Often an undesired effect appears as a yellowing or as a stronger coloring of the protective material and as a deterioration in transparency.

The drawback is typical e.g. in connection with LED light sources producing white or blue light, in the range of effect of which a darkening of the protective material and thus a deterioration in transparency have been observed.

The drawback mainly appears in connection with LED light sources, the wavelength of which is short and mainly UV light, i.e. mainly with blue and white LEDs. The problem is thus the darkening of the protective plastic occurring from the combined effect of UV and heat, e.g. the heat produced by a LED light source. Another drawback is also the impurity that gains access to the surface of a LED light source via diffusion for the aforementioned reasons, which darkens the surface of the LED circuit.

Earlier an epoxy resin type of protective agent was used in the protection inside the enclosure of a LED light source, but there has been a shift to the use of silicon resin in the high bright components available nowadays. This has been assumed to improve the lifetime of LED luminaires, but at the same time it has enabled detrimental characteristics, such as the diffusion of substances, when the temperature achieved by a light source is higher than in conventional LEDs of lower intensity. An obstacle to the use of epoxy in these cases has been exactly those same problems, the changing of the color of the protective material. Silicon, for its part, is also soft and does not give very good mechanical protection, and is not as such good protection against damp in demanding conditions.

The drawbacks of prior art are substantial, e.g. in connection with LED light-source bands, which have as protection a flexible transparent protective envelope. LED light-source bands can be used e.g. in connection with various systems, such as for guiding people in situations of danger, such as in fire situations, to the emergency exits of buildings or vessels. These are various lightings for emergency exits. Known in the art are guidance lights, in which light sources are fixed consecutively into the shape of a band. The light sources of the band are arranged to light up in a situation of danger and to illuminate the emergency exit. Darkening of the plastic material functioning as protective material, however, impairs the brightness of the light sources, which is a great drawback e.g. in fire situations, in which visibility can otherwise be poor e.g. owing to the formation of smoke.

The aim of the present invention is to achieve an entirely new type of solution for a LED luminaire, by means of which solution the drawbacks of prior art solutions are avoided. Another aim is to achieve a LED light-source band, the clarity and/or transparency of the protective material of which remain good.

BRIEF DESCRIPTION OF THE INVENTION

The light source according to the invention is mainly characterized in that the light-emitting component is at least partly protected with a transparent protective material, which contains aliphatic thermoplastic polyurethane (TPU).

The light-source band according to the invention is characterized in that the light source, or at least the light-emitting component of the light source, is at least partly protected with a transparent protective material, which contains aliphatic thermoplastic polyurethane (TPU).

The solution according to the invention has a number of important advantages. By protecting a LED light source or a light-producing diode with the protective material according to the invention a solution is achieved with which the drawbacks of prior-art solutions are avoided. The protective material remains clear and transparent despite the effect of light and/or the effect of heat. In this case the visibility of the light produced by the light sources remains as designed and no undesirable dimming occurs. When using optical aliphatic thermoplastic polyurethane (aliphatic TPU) as a protective material, the desired protective effect is achieved. In addition, the protective material also has other properties required in the use according to the object of the invention, in which case it is flexible and withstands mechanical wear well. Furthermore, the solution according to the invention is suited both as the protective material of individual light sources and as the envelope material of a light-source band. Furthermore the lens of a LED light source can be formed from the material, or it can be used as a film in connection with the lens or as a protective film in connection with a light source component. The protective material can thus be used directly on the surface of LEDs (encapsulation or potting), in the enclosure to replace silicon, in which case good elasticity and, with respect to silicon, better mechanical properties are achieved. The protective material can be used a protective coating on top of soldered components, forming an unbroken layer also on top of the silicon lenses of LED light sources. The light sources according to the invention can be used well e.g. in connection with high bright light sources, e.g. in connection with LED light-source bands, which have a flexible transparent protective envelope as protection. LED light-source bands according to the invention can be used e.g. in connection with various systems, such as for guiding people in situations of danger, such as in fire situations, to the emergency exits of buildings or vessels. These are various lightings for emergency exits. Known in the art are guidance lights, in which light sources are fixed consecutively into the shape of a band. The light sources of the band are arranged to light up in a situation of danger and to illuminate the emergency exit. The aliphatic thermoplastic polyurethane to be used as a protective material remains clear, in which case e.g. in fire situations the brightness of the light sources used for guidance of an emergency exit helps in finding the emergency exit although visibility is impaired owing to smoke formation.

BRIEF DESCRIPTION OF THE FIGURES

In the following, the invention will be described in more detail by the aid of an embodiment with reference to the attached drawings, wherein.

DETAILED DESCRIPTION OF THE INVENTION

Figure 2:
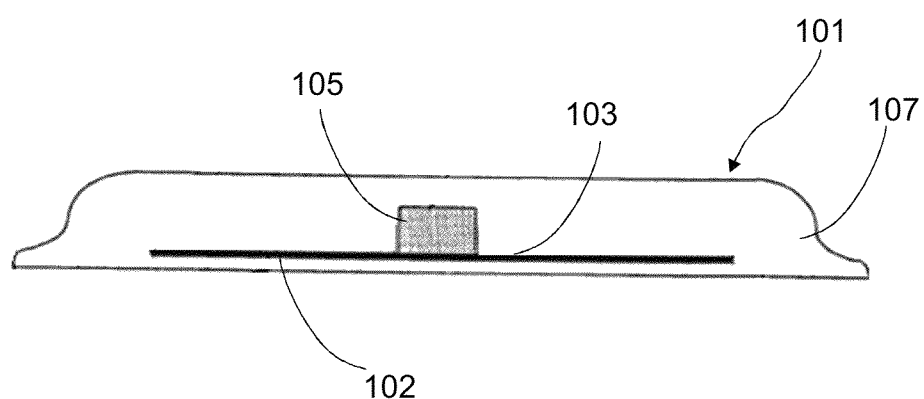
FIG. 2 presents a cross-section of the light-source band according to FIG. 1.
Figure 1:
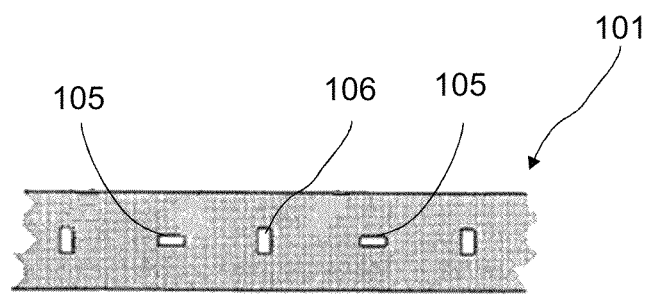
FIG. 1 presents a top view of a light-source band according to the invention.

FIG. 1 presents a flat LED light-source band 101, which is used e.g. to guide the passage of people in various premises, e.g. at airports or in hospitals. It is typically approx. 20 mm in width and approx. 4-5 mm in thickness. It contains in the center a thin elastic circuit board 102, which consists of a band of an elastic plastic material and of copper wiring 103 made on the top of or on the bottom of said band e.g. by etching or by printing. LED light sources 105, and additionally also other components, e.g. resistors 106 for controlling and protecting the LED light sources, are connected to the top surface of the circuit board at regular intervals. The LED light sources 105 can be monochromatic or polychromatic, and the desired guidance function can be obtained with them by controlling them to flash, to run, et cetera. According to FIG. 2, the circuit board 102 and the components connected to it are surrounded with a transparent envelope part 107 of a plastic material around them such that preferably a fully waterproof LED light-source band, typically of e.g. protection class IP68, is obtained.

Figure 3:
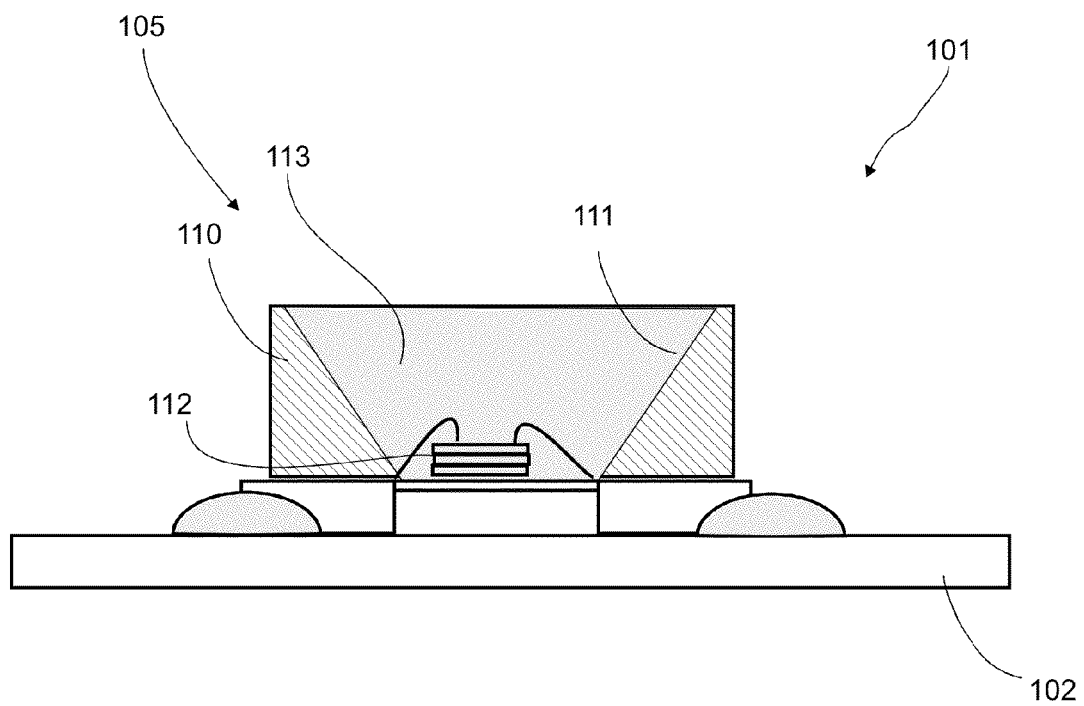
FIG. 3 presents a light source according to an embodiment of the invention.

FIG. 3 presents a simplified and magnified view of a LED light source 105 arranged on an elastic circuit board 102. The LED light source comprises a light-emitting diode 112 and surrounding it at least in the lateral direction a reflector body 110, comprising a reflector surface 111. The reflector body comprises a recess, the side walls of which form reflector surfaces. The light-emitting component 112 is disposed in the recess of the reflector body 110. The recess is filled at least partly with transparent protective material 113 such that the light-emitting diode 112 is at least partly inside the protective material. The protective material comprises a material that withstands light well, more particularly the light produced by the LED light source and/or UV light, and/or temperature without significantly darkening. The protective material 113 is, according to the invention, partly or wholly optical aliphatic thermoplastic polyurethane (aliphatic TPU).

Figure 5:
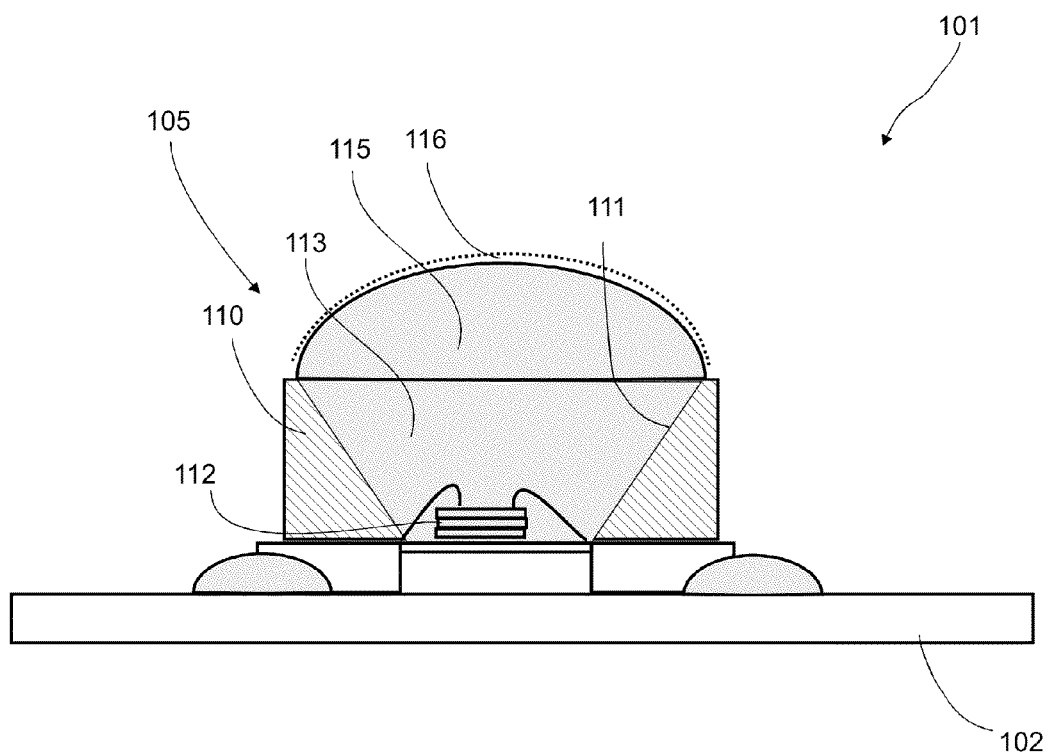
FIG. 5 presents a light source according to a second embodiment of the invention.

According to FIG. 5 on top of the protective material 113 of the light-emitting diode 112 is a lens 115, which can be of the same material as or of different material to the protective material 113. In one case the outer surface of the lens 115 can be treated with a protective material film 116, which is of aliphatic thermoplastic polyurethane, according to the invention. In this case, it can be conceived that the lens 115 is of something else, e.g. of silicon. On the other hand, both the protective material 113 and the lens 115 can be of the aforementioned aliphatic thermoplastic polyurethane, in which case the protective material film 116 is not needed.

Figure 4:
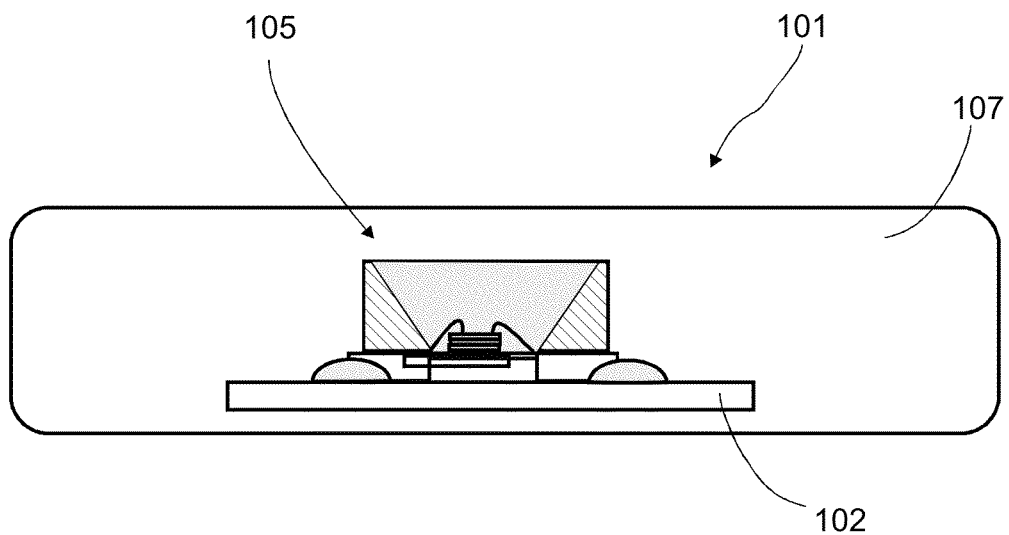
FIG. 4 presents a cross-section of a light-source band according to an embodiment of the invention.

FIG. 4 presents yet another embodiment, in which the LED band 101 of FIG. 3 is surrounded with an envelope part 107. According to one embodiment the envelope part 107 is wholly or partly of aliphatic thermoplastic polyurethane, which keeps its clarity and transparency well, even though a photo effect, such as a UV light effect, and/or a thermal effect acts on it. In addition, an envelope part 107 formed from the material in question withstands mechanical loads well. The envelope part 107 thus functions partly or wholly as a protective material, the clarity of which and/or the transparency of which is retained well.

According to the invention optical aliphatic TPU (aliphatic Thermoplastic Polyurethane) is thus used, either partly or wholly, as a protective material. This material has been used, or is used, e.g. as a thin film, inter alia, between the windshield glasses of vehicles or on the outer surface of glass in airplanes. This has been observed to possess very good UV durability.

According to one embodiment the material according to the invention is applied by extrusion onto the LED band, such as is described e.g. in publication WO9823896 A1 in connection with a conducting tape.

Optical aliphatic thermoplastic polyurethane (TPU) could be used, depending on the embodiment, directly on the surface of LEDs (encapsulation or potting), in the enclosure to replace silicon. In this case also an elastic structure and better mechanical properties are achieved.

According to one embodiment the material in question, i.e. optical aliphatic thermoplastic polyurethane, could be a protective coating on top of soldered components, forming an unbroken layer also on top of silicon lenses.

According to one embodiment the protective material is clear aliphatic thermoplastic polyurethane, e.g. of the type Estane® ALR E87A. Also other suitable aliphatic TPU materials can be used.

An elastic light-source band according to the invention can be manufactured in a continuous manufacturing process, such as with an extrusion process, roll-to-roll.

According to one embodiment the light-emitting diode 112 is more particularly a diode emitting blue or white light.

According to one embodiment the light source or light-source band are emergency exit luminaires, or are parts thereof, or control luminaires, guidance luminaires or signaling luminaires, or are parts thereof.

The invention thus relates to a LED light source 105, which comprises at least one light-emitting component 112. The light-emitting component 112 is at least partly protected with a transparent protective material 113, which contains aliphatic thermoplastic polyurethane (TPU).

According to one embodiment the light-emitting component 112 is arranged in a recess, which is at least partly filled with protective material 113.

According to one embodiment the protective material is wholly aliphatic thermoplastic polyurethane (TPU).

According to one embodiment the protective material is partly aliphatic thermoplastic polyurethane (TPU).

According to one embodiment the protective material film 116 containing aliphatic thermoplastic polyurethane TPU is arranged on top of the light-emitting component 112 and/or the protective material 113 and/or the lens 115.

According to one embodiment the LED light source 105 is wholly protected with a transparent protective material, which contains aliphatic thermoplastic polyurethane (TPU).

According to one embodiment the light-emitting diode 112 is more particularly a diode emitting blue or white light.

The invention also relates to a light-source band, which comprises light sources 105, such as LED light sources, arranged consecutively, which light-source band is surrounded at least partly with a transparent envelope 107. The light source 105, or at least the light-emitting component 112 of the light source, is at least partly protected with a transparent protective material, which contains aliphatic thermoplastic polyurethane (TPU).

According to one embodiment the LED light source 105 is wholly protected with a transparent envelope 107, which contains aliphatic thermoplastic polyurethane (TPU).

According to one embodiment the envelope 107 is a flexible envelope.

It is obvious to the person skilled in the art that the invention is not limited to the embodiments presented above, but that it can be varied within the scope of the claims presented below. The characteristic features possibly presented in the description in conjunction with other characteristic features can also, if necessary, be used separately to each other.

The invention claimed is:

1. A LED light source, comprising:
   a light-emitting component with lateral sides and an upwardly-facing side,
   a reflector body formed with a recess in a central portion thereof, the reflector body having an reflector surface that faces inwardly toward the recess, and
   a transparent protective material containing an aliphatic thermoplastic polyurethane (TPU),
   wherein the light-emitting component is disposed in the recess of the reflector body and is encapsulated within the transparent protective material containing the aliphatic thermoplastic polyurethane (TPU) in a manner such that the aliphatic thermoplastic polyurethane (TPU) directly covers the lateral sides and the upwardly-facing side of the light-emitting component, and
   the light-emitting component is a light-emitting diode emitting blue or white light.

2. The LED light source according to claim 1, wherein the transparent protective material is partly or wholly the aliphatic thermoplastic polyurethane (TPU).

3. The LED light source according to claim 1, wherein the transparent protective material is partly the aliphatic thermoplastic polyurethane (TPU).

4. The LED light source according to claim 1, further comprising:
   a lens arranged on top of the transparent protective material, the lens having a flat bottom surface facing the upwardly-facing side of the light-emitting component, and
   a protective material film containing the aliphatic thermoplastic polyurethane (TPU) arranged on top of the lens.

5. The LED light source according to claim 1, wherein the LED light source is wholly protected with the transparent protective material containing the aliphatic thermoplastic polyurethane (TPU).

6. The LED light source according to claim 1, wherein the reflector body is shaped as a truncated-cone, with a narrowest portion of the truncated-cone directly facing the lateral sides of the light-emitting component in a radial direction of the reflector body.

7. A light-source band, comprising:
   LED light sources arranged consecutively along the light-source band, each of the LED light sources including:
   a light-emitting component with lateral sides and an upwardly-facing side,
   a reflector body formed with a recess in a central portion thereof, the reflector body having an reflector surface that faces inwardly toward the recess, and
   a transparent protective material containing an aliphatic thermoplastic polyurethane (TPU),
   wherein the light-emitting component is disposed in the recess of the reflector body and is encapsulated within the transparent protective material containing the aliphatic thermoplastic polyurethane (TPU) in a manner such that the aliphatic thermoplastic polyurethane (TPU) directly covers the lateral sides and the upwardly-facing side of the light-emitting component, and
   the light-emitting component is a light-emitting diode emitting blue or white light.

8. The light-source band according to claim 7, wherein each of the LED light sources is wholly protected with the transparent envelope containing the aliphatic thermoplastic polyurethane (TPU).

9. The light-source band according to claim 7, wherein each of the light-emitting components is at least partly protected with the transparent protective material containing the aliphatic thermoplastic polyurethane (TPU).

10. The light-source band according to claim 7, wherein the transparent envelope is a flexible envelope.

11. The LED light source according to claim 1, wherein the transparent protective material is wholly the aliphatic thermoplastic polyurethane (TPU).

12. The LED light source according to claim 1, wherein the transparent protective material is partly the aliphatic thermoplastic polyurethane (TPU).

13. The LED light source according to claim 2, wherein the transparent protective material is partly the aliphatic thermoplastic polyurethane (TPU).

14. The LED light source according to claim 1, wherein the aliphatic thermoplastic polyurethane (TPU) is contained in a protective material film arranged on top of the light-emitting component and/or the transparent protective material and/or a lens.

15. The LED light source according to claim 1, wherein the aliphatic thermoplastic polyurethane (TPU) is contained in a protective material film arranged on top of the light-emitting component and/or the transparent protective material and/or a lens.

16. The LED light source according to claim 2, wherein the aliphatic thermoplastic polyurethane (TPU) is contained in a transparent protective film arranged on top of the light-emitting component and/or the transparent protective material and/or or a lens.

17. The LED light source according to claim 1, wherein the LED light source is wholly protected with the transparent protective material containing the aliphatic thermoplastic polyurethane (TPU).

18. The LED light source according to claim 2, wherein the LED light source is wholly protected with the transparent protective material containing the aliphatic thermoplastic polyurethane (TPU).

19. The LED light source according to claim 3, wherein the LED light source is wholly protected with the transparent protective material containing the aliphatic thermoplastic polyurethane (TPU).

20. A LED light source, comprising:
   a light-emitting component with lateral sides and an upwardly-facing side,
   a reflector body formed with a recess in a central portion thereof, the reflector body having an reflector surface that faces inwardly toward the recess, and
   a transparent protective material containing an aliphatic thermoplastic polyurethane (TPU),
   wherein the light-emitting component is disposed in the recess of the reflector body and is encapsulated within the transparent protective material containing the aliphatic thermoplastic polyurethane (TPU) in a manner such that the aliphatic thermoplastic polyurethane (TPU) directly covers the lateral sides and the upwardly-facing side of the light-emitting component, and
   wherein the reflector body is shaped as a truncated-cone, with a widest portion of the truncated-cone being arranged above the lateral sides and the upwardly facing side of the light-emitting component.

21. A light-source band, comprising:
   LED light sources arranged consecutively along the light-source band, each of the LED light sources including:
   a light-emitting component with lateral sides and an upwardly-facing side, a reflector body formed with a recess in a central portion thereof, the reflector body having an reflector surface that faces inwardly toward the recess, and a transparent protective material containing an aliphatic thermoplastic polyurethane (TPU), wherein the light-emitting component is disposed in the recess of the reflector body and is encapsulated within the transparent protective material containing the aliphatic thermoplastic polyurethane (TPU) in a manner such that the aliphatic thermoplastic polyurethane (TPU) directly covers the lateral sides and the upwardly-facing side of the light-emitting component, wherein the reflector body is shaped as a truncated-cone, with a widest portion of the truncated-cone being arranged above the lateral sides and the upwardly facing side of the light-emitting component.

* * * * *